United States Patent
Lee et al.

(10) Patent No.: US 7,221,578 B2
(45) Date of Patent: May 22, 2007

(54) FERROELECTRIC RANDOM ACCESS MEMORY DEVICE AND METHOD FOR DRIVING THE SAME

(75) Inventors: Han-Joo Lee, Seoul (KR); Byung-Gil Jeon, Suwon-si (KR); Byung-Jun Min, Yongin-si (KR); Kang-Woon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/324,560

(22) Filed: Jan. 3, 2006

(65) Prior Publication Data
US 2006/0146592 A1 Jul. 6, 2006

(30) Foreign Application Priority Data
Jan. 4, 2005 (KR) .................. 10-2005-0000339

(51) Int. Cl.
*G11C 11/22* (2006.01)
(52) U.S. Cl. .................. 365/145; 365/226
(58) Field of Classification Search ........... 365/145, 365/149, 226, 227, 191, 193
See application file for complete search history.

(56) References Cited

U.S. PATENT DOCUMENTS

| 5,574,679 | A | | 11/1996 | Ohtsuki et al. |
| 5,943,257 | A | * | 8/1999 | Jeon et al. .................. 365/145 |
| 6,643,162 | B2 | * | 11/2003 | Takeuchi et al. ............ 365/145 |
| 6,850,428 | B2 | * | 2/2005 | Kang .......................... 365/145 |

* cited by examiner

Primary Examiner—Gene N. Auduong
(74) Attorney, Agent, or Firm—F. Chau & Assoc., LLC (57) ABSTRACT

A ferroelectric random access memory (FRAM) device and a driving method thereof are provided that reduce data loss in an operation of the FRAM device. A power supply supplies a power source to the memory device. A power detection circuit detects a voltage level of the power supply and generates a detection signal when the power source has an off state. In an internal chip enable (ICE) signal generation circuit, an ICE signal is disabled to stop operation of the memory device when the ICE signal is enabled and the detection signal is applied at a first time point, and an enabled state of the ICE signal is maintained when the detection signal is applied at a second time point, wherein the operation of the FRAM device continues by control signals generated from the ICE signal.

16 Claims, 10 Drawing Sheets

FERROELECTRIC RANDOM ACCESS MEMORY DEVICE AND METHOD FOR DRIVING THE SAME

CROSS-REFERENCE TO RELATED APPLICATION

The present application claims priority under 35 USC § 119 to Korean Patent Application No. 2005-0000339, filed Jan. 4, 2005, which is incorporated by reference herein in its entirety.

BACKGROUND OF THE INVENTION

1. Technical Field

The present invention relates to a semiconductor memory device, and more particularly, to a ferroelectric memory device and a driving method thereof.

2. Description of the Related Art

The use of ferroelectric thin film as dielectric film of a capacitor has been developed to overcome limitations due to the need to refresh Dynamic Random Access Memories (DRAM). A ferroelectric random access memory (FRAM or FeRAM) uses such ferroelectric thin film. A FRAM can be used as main memory in various electronic equipment having file storage and search functions, such as portable computers, cellular phones and game machines, or as a recording medium for voice or images.

In a FRAM, a memory cell comprises a ferroelectric capacitor and an access transistor. By electric polarization of the ferroelectric capacitor, a logic state '1' or '0' is stored in the memory cell. When voltage is applied to both ends (terminals) of the ferroelectric capacitor, ferroelectric material is polarized by the direction of a produced electric field. A switching threshold voltage that a polarization state of the ferroelectric material is changed, is a coercive voltage. To read data stored in the memory cell, a voltage is applied to generate a potential difference between both electrodes of the ferroelectric capacitor, and a logic state of the data stored in the memory cell is sensed by a change of the charge sent to a bit line.

Figure 1:
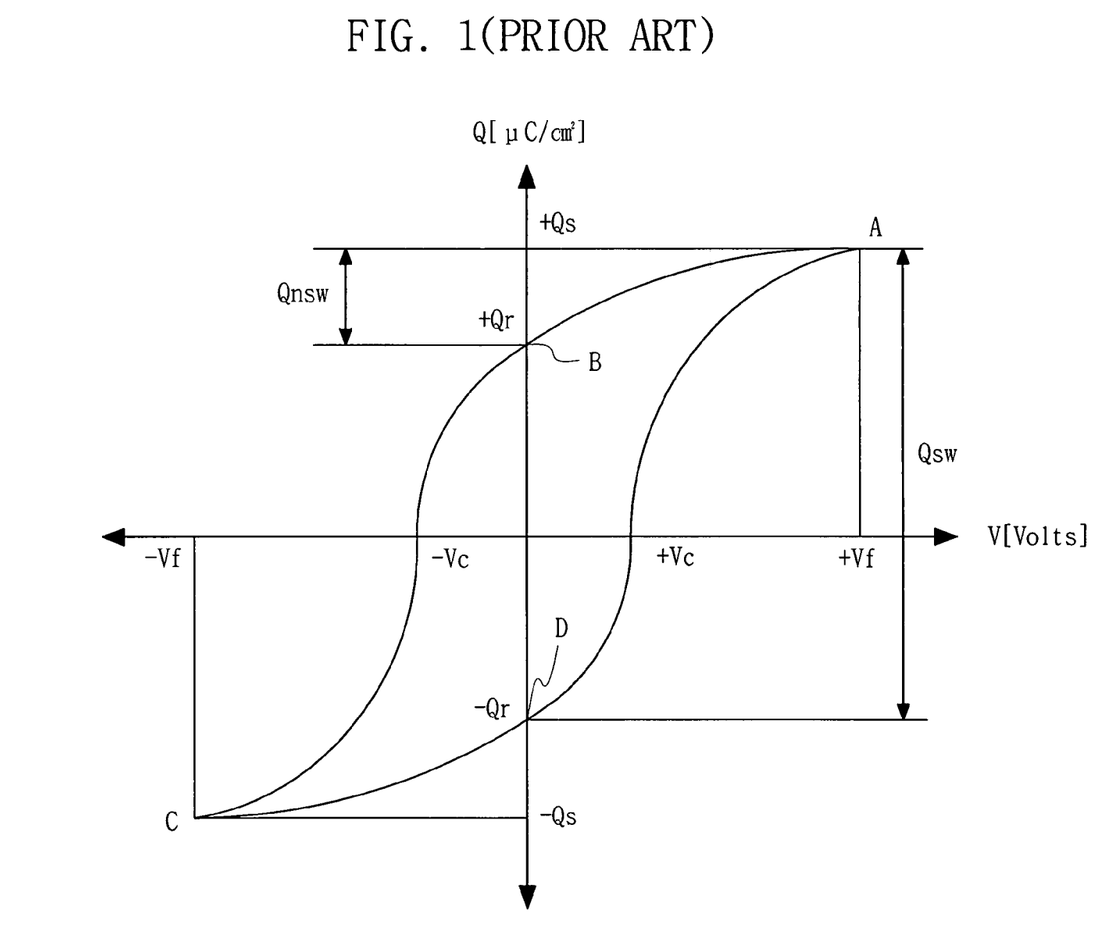
FIG. 1 illustrates a hysteresis curve for ferroelectric material of a conventional ferroelectric capacitor.

FIG. 1 illustrates a hysteresis curve for ferroelectric material of a conventional ferroelectric capacitor.

Referring to FIG. 1, when a ground voltage Vss of about 0 volts is applied and no electric field is applied to the ferroelectric material, polarization is not generated. When voltage of both ends of a ferroelectric capacitor increases in a positive direction, a polarization level or charge amount increases to a first state point A of a positive polarization region from zero. At the first state point A, polarization is generated in one direction, and a polarization level of the first state point A has the largest value. At this time, the polarization level, namely, the charge amount that ferroelectric material retains, is represented as +Qs. Even if voltage of both ends of the capacitor falls to ground voltage Vss, the polarization level does not fall to zero but remains at a second state point B. The charge amount that ferroelectric material retains by such remaining polarization, a residual polarization level, is represented as +Qr. Then, when voltage of both ends of the capacitor reverses in a negative direction, a polarization level is changed to a third state point C of a negative charge polarization region from the second state point B. At the third state point C, the ferroelectric material is polarized to a direction opposite to the polarization direction of the first state point A. At this time, the polarization level is represented as −Qs. Even if voltage of both ends of the capacitor falls to a ground voltage Vss, a polarization level does not fall to zero but remains at a fourth state point D. At this time, the residual polarization level is represented as −Qr. When voltage applied to both ends of the capacitor increases in a positive direction, a polarization level of ferroelectric material is changed to the first state point A from the fourth state point D.

Figure 2:
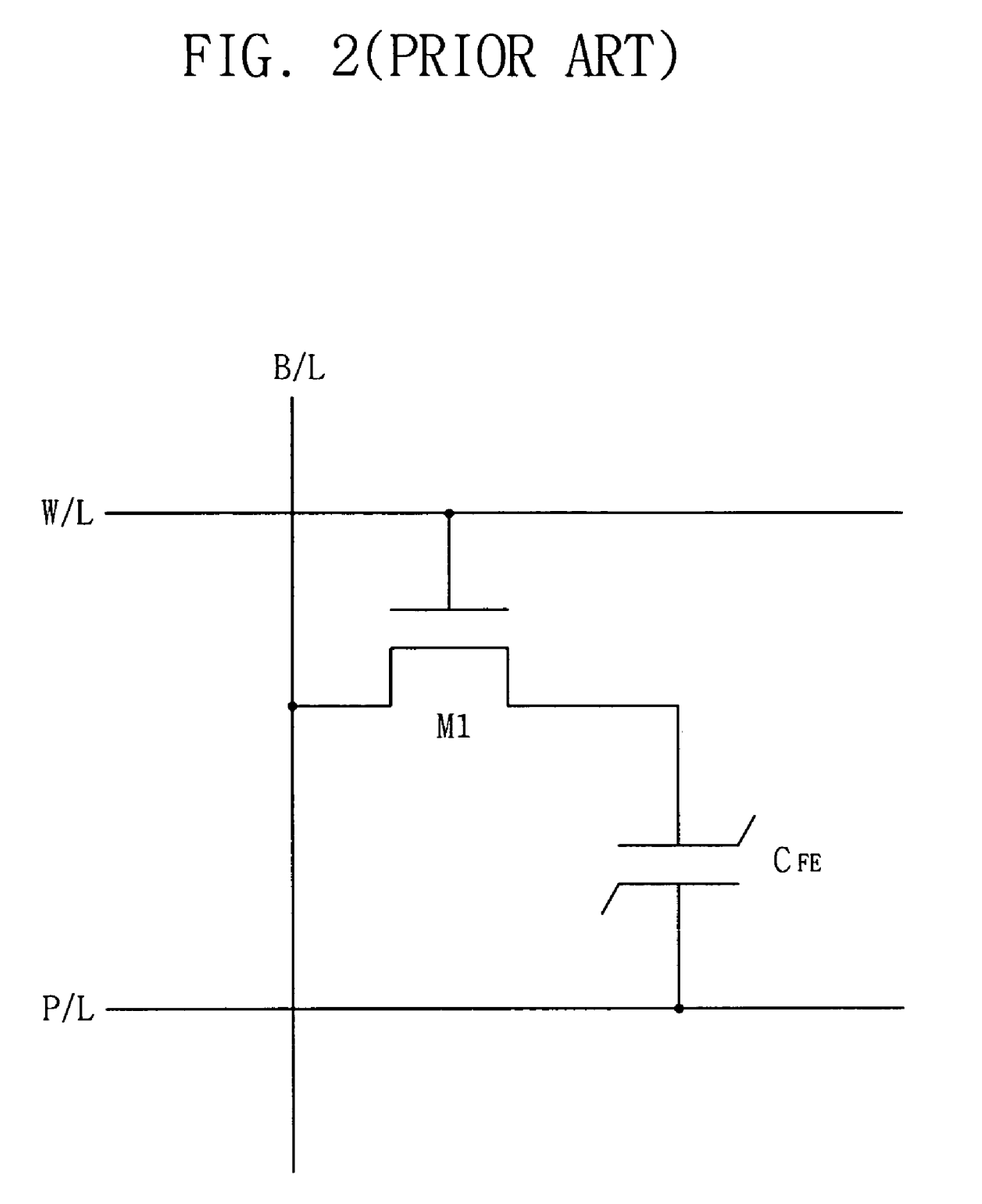
FIG. 2 is a circuit diagram of a memory cell of a memory cell array in a conventional ferroelectric random access memory.

FIG. 2 is a circuit diagram of a memory cell of a memory cell array in a conventional ferroelectric random access memory.

With reference to FIG. 2, a memory cell is constructed of one access transistor M1 and one ferroelectric capacitor $C_{FE}$. The access transistor M1 has a drain terminal connected to a bit line B/L, a gate connected to a word line W/L, and a source terminal connected to a first terminal of the ferroelectric capacitor $C_{FE}$. A second terminal of the ferroelectric capacitor $C_{FE}$ is connected to a plate line P/L.

When a voltage to generate an electric field is applied to a ferroelectric capacitor having ferroelectric material inserted between two electrodes and even though the electrodes are in a floating state, a polarization direction is maintained. The surface charge of ferroelectric materials is not lost naturally through leakage. If the voltage is not applied in an opposite direction sufficiently enough for the polarization level to become zero, the polarization direction is maintained.

When a voltage is applied in a positive direction to the ferroelectric capacitor and then removed, a residual polarization of the ferroelectric material of the ferroelectric capacitor enters a state of +Qr. When a voltage is applied in a negative direction to the ferroelectric capacitor and then removed, the residual polarization of the ferroelectric material enters a state of −Qr. Herewith, a logic state indicates data '0' when the residual polarization has a state of +Qr, namely, at the second state point B, and a logic state indicates data '1' when the residual polarization has a state of −Qr, namely, at the fourth state point D. Thus, the difference in charge when changing from the first state point A to the second state point B (namely, a voltage corresponding to the amount of non-switching capacitance Qnsw), is distinguished from the difference in charge when changing from the fourth state point D to the first state point A (namely, a voltage corresponding to the amount of switching capacitance Qsw), thereby allowing reading of the data stored in the memory cell.

A FRAM generally operates by an external chip control signal as an external enable signal or an external chip selector signal input from the outside when a power source is supplied. When the external chip control signal is enabled, an applied external address transition is detected to control a cycle operation by using a composite pulse signal obtained by combining respective address transition detection signals (ATD). An internal clock is generated by the composite pulse signal, and read and write operations for a memory located at the corresponding address is performed. That is, when an external address is changed, a composite pulse signal is generated, and a preceding cycle operation is completed by this signal and the next cycle preparation operation proceeds. Further, an internal chip enable signal (ICE) is generated by the composite pulse signal, and all internal control signals for the operation of a memory device are generated by the ICE signal.

In such a FRAM a loss of power suffered by the external power source may cause fatal defects. In particular, during reading of the data stored at memory cells of a FRAM, data is sensed and then operation to restore the original data is performed, but in case a restoring section is insufficient and power is cut off, the existing data cannot be preserved and data is lost.

Figure 3:
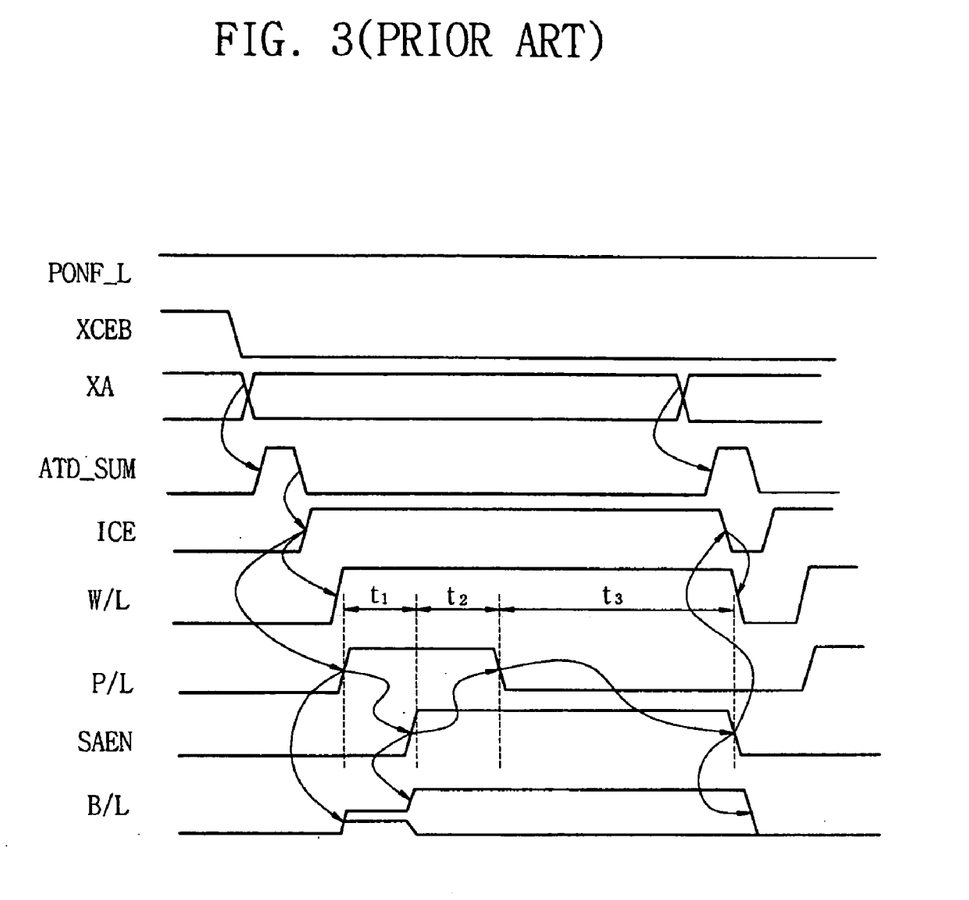
FIG. 3 is a timing diagram illustrating a normal read operation in a conventional ferroelectric random access memory.

FIG. 3 is a timing diagram illustrating a normal read operation in a conventional ferroelectric random access memory.

As shown in FIG. 3, a read operation in a conventional ferroelectric random access memory (FRAM) starts by a transition of an external chip control signal XCEB from a 'high' logic level to a 'low' logic level.

An external address signal XA is applied by the enabling of the external chip control signal XCEB. The external address signal XA is applied to an address buffer circuit (not shown). The address buffer circuit buffers the applied external address signal XA and generates an internal address signal, and detects a transition of the internal address signal and generates address transition detection signals for respective address signals. The address transition detection signals are added by a composite pulse signal generation circuit, and become a composite pulse signal ATD_SUM as a single address transition detection signal.

An internal chip enable (ICE) signal ICE is generated by the composite pulse signal ATD_SUM, and all internal control signals necessary for operation of a memory device are generated by the ICE signal ICE. The ICE signal ICE is not generated in a transition for an enabling of the composite pulse signal ATD_SUM, but is generated in a transition for a disabling of the composite pulse signal ATD_SUM, after all the address transition detection signals are applied.

When the ICE signal ICE is generated, a word line W/L is enabled by a word line decoder and driver circuit (not shown). Further, a plate line P/L is enabled by an enabling of plate control signal PPLS generated in response to the ICE signal ICE.

When the plate line P/L is enabled, a charge sharing section $t_1$ starts. A voltage corresponding to data stored in a memory cell at a bit line B/L is held at a low voltage level.

Next, a sense amplifier is enabled, and the charge sharing section $t_1$ is completed, and a sensing section $t_2$ starts. At the sensing section $t_2$, data at the bit line B/L is sensed and amplified by the sense amplifier.

The operation at the sensing section $t_2$ is finished by a disabling of the plate line P/L through the plate control signal, and a write-back section $t_3$ starts.

Herewith, the charge sharing section $t_1$ and the sensing section $t_2$ each have a value decided by an internal circuit.

The write-back section $t_3$ is to restore original data so data stored in a memory cell is reversed when a plate line is enabled for a general read operation.

The write-back section $t_3$ is maintained until the sense amplifier is disabled. The disabling of sense amplifier can be generated in response to a disabling of the plate line, and also can be generated in response to a transition for an enabling of second composite pulse signal ATD_SUM.

When the sense amplifier is disabled, the internal chip enable signal is disabled and thus the word line W/L is disabled, and the read operation is completed. Then, in a transition for a disabling of the second composite pulse signal ATD_SUM, an internal chip enable signal is again generated, and the next operation is performed.

Figure 4:
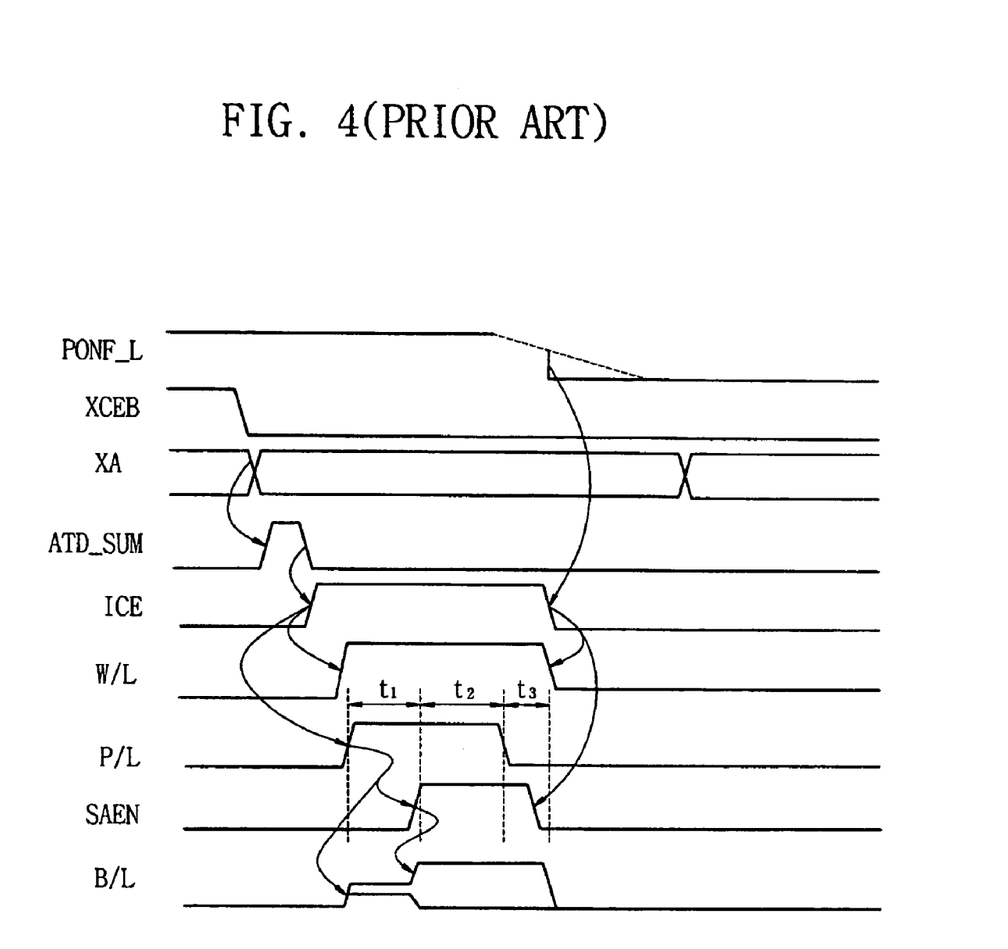
FIG. 4 is a timing diagram illustrating a power loss during a read operation in a conventional ferroelectric random access memory.

FIG. 4 is a timing diagram illustrating a power loss during a read operation in a conventional ferroelectric random access memory.

As shown in FIG. 4, in case of an abnormal read operation, the operation to the sensing section $t_2$ is the same as the description referred to in FIG. 3. The sensing section $t_2$ is finished and the write-back section $t_3$ starts to perform a restoring operation. However, when power is turned off for a shorter time than the time to perform a normal restoring operation, the ICE signal ICE is disabled. Then the word line W/L is disabled, and the plate control signal PPLS and the sense amplifier enable signal SAEN are disabled. Thus, the read operation is prematurely completed before the completion of the write-back section $t_3$, and data stored in the memory cells is lost.

U.S. Pat. No. 5,943,257 discloses first and second detection signals having different voltage levels to indicate whether a power source of a power supply is on or off. When the power source is off, it is determined whether an external chip control signal XCE has an enabled state or disabled state. If the disabled state exists, a chip enters an off state to halt operation, and if the enabled state exists, a minimum time is maintained to complete a read operation before it enters an off state.

In such proposed technique, when the external chip enable signal XCE has an enabled state, and control signals for operations are not generated, the restoring operation in read operation is performed at a voltage lower than normal, thus decreasing sensing margin and degrading retention characteristic.

SUMMARY OF THE INVENTION

Embodiments of the present invention provide a ferroelectric random access memory (FRAM) device and a method of driving the same that reduce data loss in an operation of the FRAM device.

According to one aspect of the present invention, a FRAM device comprises a power supply for supplying a power source to the FRAM device, a power detection circuit for detecting a voltage level of the power source of the power supply and generating a detection signal when the power source has an off state, and an internal chip enable (ICE) signal generation circuit for disabling an ICE signal to stop an operation of the FRAM device when the ICE signal is enabled and the detection signal is applied at a first time point, and for maintaining an enabled state of the ICE signal when the detection signal is applied at a second time point, wherein the operation of the FRAM device continues by control signals generated from the ICE signal. The first time point may occur before a control signal for the operation of the FRAM device is generated in response to the ICE signal, and the second time point may occur after a control signal for the operation is generated in response to the ICE signal. The operation for the memory device may be a read operation to read data stored at a selected memory cell in the FRAM device.

The ferroelectric memory device may further comprise a plate control signal generation circuit for generating a plate control signal for enabling or disabling a plate line connected to the memory cell in response to an ICE signal, and a sense amplifier enable signal generation circuit for enabling or disabling a sense amplifier enable signal for driving a sense amplifier in response to the plate control signal. Herewith, the first time point may occur before the plate control signal is enabled, and the second time point may occur after the plate control signal is enabled.

According to another aspect of the present invention, when the detection signal is not applied, the ICE signal generation circuit enables the ICE signal in response to a composite pulse signal, when the detection signal is applied at the first time point, the ICE signal generation circuit disables the ICE signal in response to the plate control and sense amplifier enable signals having disabled states, and the detection signal, and when the detection signal is applied at the second time point, the ICE signal generation circuit maintains an enabled state of the ICE signal in response to the plate control and sense amplifier enable signals having enabled states, and the detection signal.

According to still another aspect of the present invention, a FRAM device comprises a plurality of memory cells, wherein each memory cell includes an access transistor and a ferroelectric capacitor, a power detection circuit for detecting a voltage level of the power source of the power supply and generating a detection signal when the power source is in an off state, and an ICE signal generation circuit for disabling an ICE signal to stop an operation of the FRAM device when the ICE signal is enabled and the detection signal is applied at a first time point, and for maintaining an enabled state of the ICE signal when the detection signal is applied at a second time point, wherein the FRAM device controls an enabled or disabled state of the ICE signal that controls an enable of word lines and plate lines connected with the memory cells.

The FRAM device may further comprise a plate control signal generation circuit for generating a plate control signal of enabling or disabling a plate line connected to the memory cell in response to an ICE signal; and a sense amplifier enable signal generation circuit for enabling or disabling a sense amplifier enable signal of driving a sense amplifier in response to the plate control signal. The ICE signal generation circuit enables the ICE signal in response to a composite pulse signal when the detection signal is not applied, and disables the ICE signal in response to the plate control signal having a disabled state, the sense amplifier enable signal having a disabled state and the detection signal when the detection signal is applied at the first time point, and maintains an enabled state of the ICE signal in response to the plate control signal and the sense amplifier enable signal having an enabled state, and the detection signal, when the detection signal is applied at the second time point.

According to another aspect of the invention, a method of driving a ferroelectric random access memory (FRAM) device comprises detecting a voltage level of a power source supplied to the FRAM device, and generating a detection signal when the power source has an off state, enabling an internal chip enable (ICE) signal to control a generation of control signals of performing an operation of the FRAM device to perform the operation in the memory device when the detection signal is not generated, and disabling the ICE signal to stop the operation of the FRAM device when the detection signal is generated at a first time point, and maintaining an enabled state of the ICE signal so that the operation of the memory device continues when the detection signal is generated at a second time point.

BRIEF DESCRIPTION OF THE DRAWINGS

The above and other features of exemplary embodiments of the invention will become readily apparent from the description that follows, with reference to the attached drawings in which.

DETAILED DESCRIPTION OF PREFERRED EMBODIMENTS

Exemplary embodiments of the present invention are more fully described below with reference to FIGS. 5 to 10.

Figure 5:
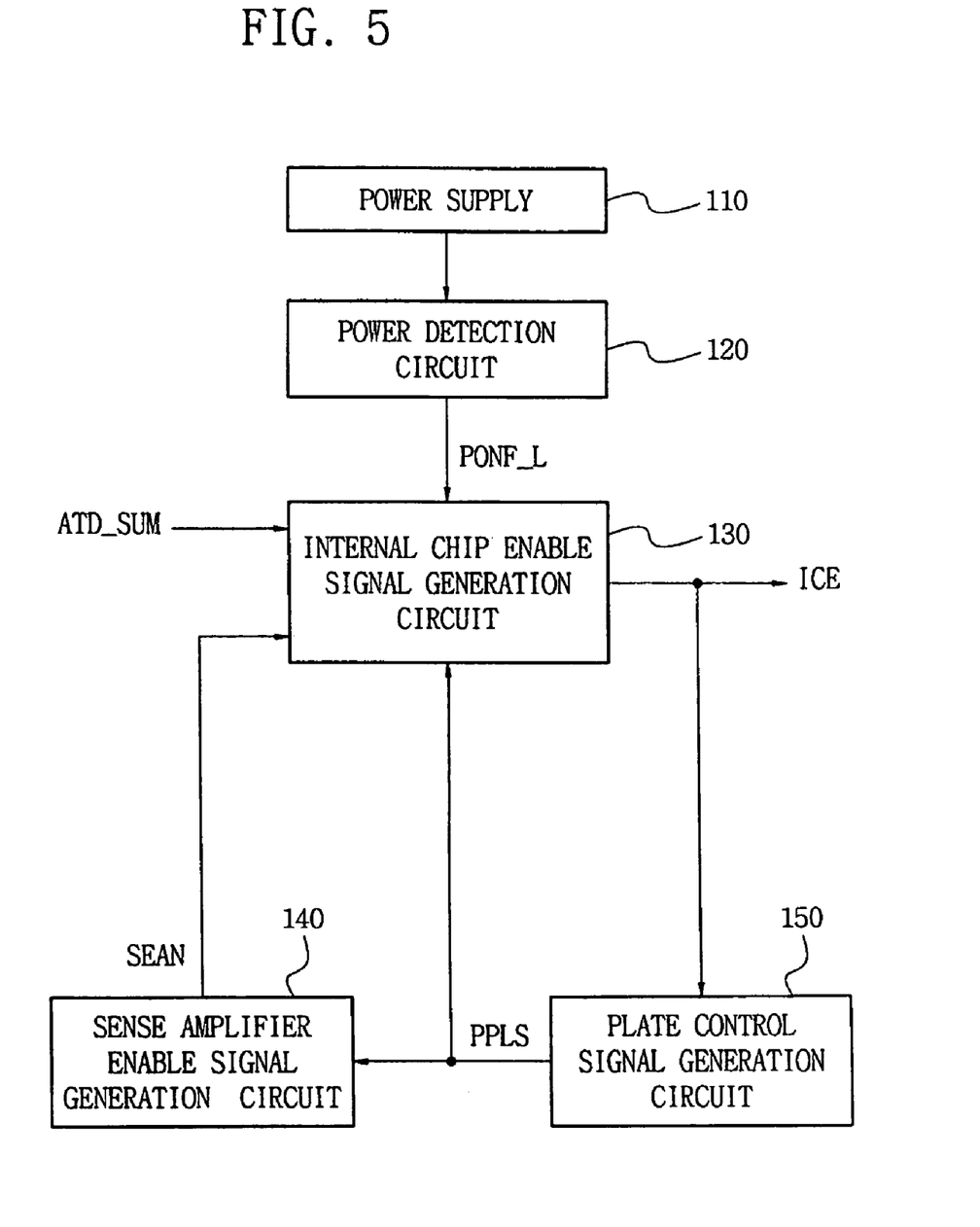
FIG. 5 is a block diagram illustrating a portion of a ferroelectric random access memory according to an exemplary embodiment of the invention.

FIG. 5 is a block diagram illustrating a portion of a ferroelectric random access memory according to an exemplary embodiment of the invention.

A ferroelectric random access memory (FRAM) device according to an exemplary embodiment of the invention includes a cell array having a plurality of memory cells as referred to in FIG. 2, and can also include all circuits for the general operation of the FRAM device, for example, read or write operation. The FRAM device according to an exemplary embodiment, except the circuits shown in FIG. 5, is well known to those skilled in the art, and a detailed description for that will be omitted and will be described only for the circuits shown in FIG. 5.

As shown in FIG. 5, a FRAM device according to an exemplary embodiment includes a power supply 110, a power detection circuit 120, an internal chip enable (ICE) signal generation circuit 130, a sense amplifier enable signal generation circuit 140 and a plate control signal generation circuit 150.

The power supply 110 supplies a power source for the FRAM device.

The power detection circuit 120 detects a voltage level of the power source supplied from the power supply 110, and generates a detection signal PONF_L when the power source has an off state. In the power detection circuit 120, when the voltage level of the power source normally has an on state, the detection signal PONF_L is maintained at a 'high' logic level, and when the power source voltage level falls below a predetermined voltage level, the detection signal is determined as an off state to transit to a 'low' logic level. The detection signal PONF_L will be described as an output signal that has a 'low' logic level when the power source has an off state.

The ICE signal generation circuit 130 controls generation of an ICE signal ICE to control generation of control signals for the operation of the FRAM device.

The internal chip enable signal generation circuit 130 enables the ICE signal ICE in response to a composite pulse signal ATD_SUM to perform normal operations when the detection signal PONF_L generated from the power detection circuit 120 is not applied.

When the power source of the power supply 110 becomes an off state and the detection signal PONF_L is generated in the power detection circuit 120, control of the ICE signal ICE changes according to a generation time point of the detection signal PONF_L in the ICE signal generation circuit 130.

When the detection signal PONF_L is applied at a first time point after a normal enable of the ICE signal ICE, the ICE signal ICE is disabled. Thus, the generation of a plate line control signal PPLS and a word line enable signal (not shown) is controlled in response to the ICE signal ICE, and the plate line control signal PPLS and the word line enable signal are not enabled. That is, the FRAM device is disabled. Herewith, the first time point occurs before the control signals to perform an operation of the FRAM device are enabled, and before a plate control signal PPLS is enabled by the plate control signal generation circuit 150. The first time point does not indicate a specific time point, but indicates any one time point that occurs from an enabling of the ICE signal ICE to before an enabling of the plate control signal PPLS.

When, after the ICE signal ICE is enabled normally, the detection signal PONF_L is applied at a second time point, the ICE signal ICE is maintained at an enabled state. Then where the control signals controlling the operation of the FRAM device, such as a plate control signal or a word line enable signal, which respond to the ICE signal ICE, are enabled, operation of the semiconductor memory device continues. This protects the data stored in the memory cells of the FRAM device by continuing to perform the operation that is currently proceeding. Herewith, the second time point occurs after the control signals to perform an operation of the FRAM device are enabled, and after a plate control signal PPLS is enabled by the plate control signal generation circuit 150. The second time point does not indicate a specific time point, but indicates any one time point that occurs from an enabling of the plate control signal PPLS to an end of an operation of the FRAM device. The time interval may be determined as an interval that is from an enabling time point of the plate control signal PPLS to a disabling of the sense amplifier enable signal SAEN that is enabled in response to the enabling of the plate control signal PPLS, to perform a read operation of the FRAM device.

The plate control signal generation circuit 150 generates a plate control signal PPLS to enable or disable a plate line connected to the memory cell in response to the ICE signal. The plate control signal generation circuit 150 can be called a plate line driver circuit and may have the same configuration as in a conventional FRAM.

The sense amplifier enable signal generation circuit 140 enables or disables a sense amplifier enable signal SAEN that drives a sense amplifier in response to the plate control signal PPLS. The sense amplifier enable signal generation circuit 140 can have the same configuration as in a conventional FRAM.

Figure 6:
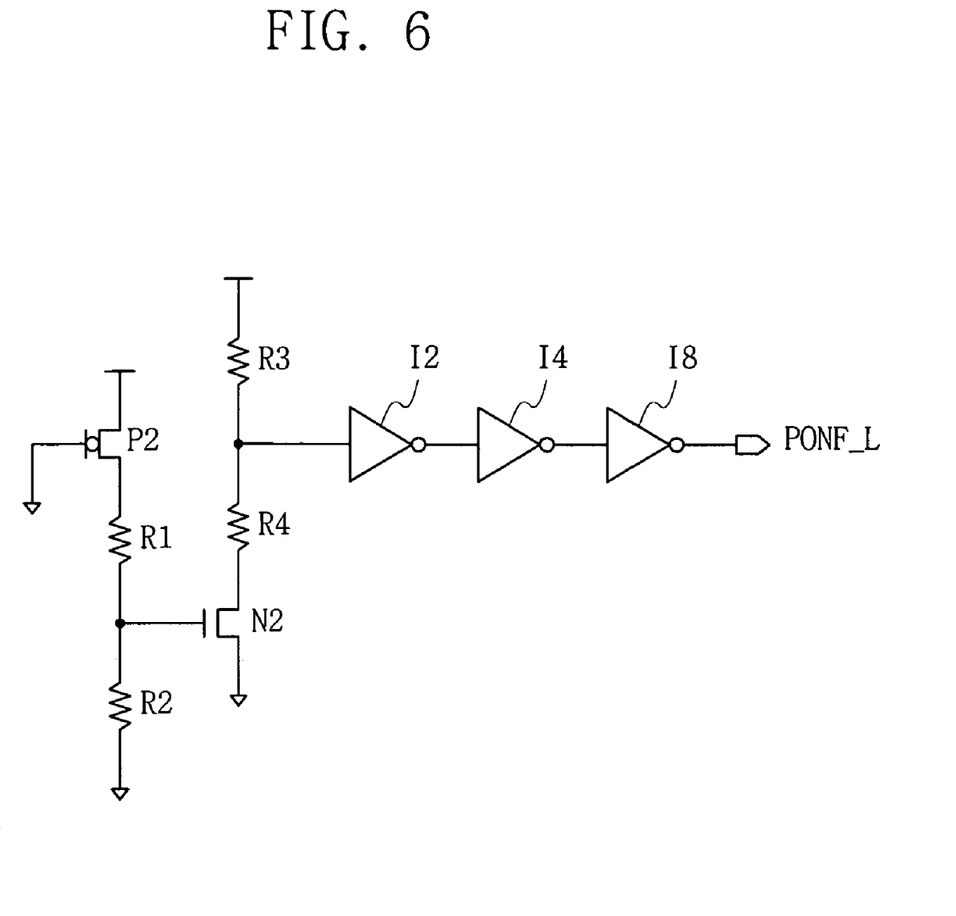
FIG. 6 illustrates the power detection circuit of FIG. 5.

FIG. 6 illustrates the power detection circuit of FIG. 5.

The power detection circuit includes first through fourth resistance elements R1 to R4, first and second transistors N2 and P2 and first, second and third inverters I2, I4 and I8, and has a wiring structure as shown in FIG. 6. The power detection circuit is designed so that the detection signal PONF_L has a 'high' logic level when the power source has an on state and has a 'low' logic level when the power source has an off state.

A determination of an on/off state of the power source in the power detection circuit can be performed through various methods by varying the resistance values of the first through fourth resistance elements R1 to R4. For example, the detection signal PONF_L can be output with a 'low' logic level when the power source has a voltage level under 80% of a desired voltage level by varying the resistance values of the first through fourth resistance elements R1 to R4.

The power detection circuit can be realized through other various methods beyond the method for the power detection circuit shown in FIG. 6, and a power detection circuit well known to those skilled in the art involving the invention can be used.

Figure 7:
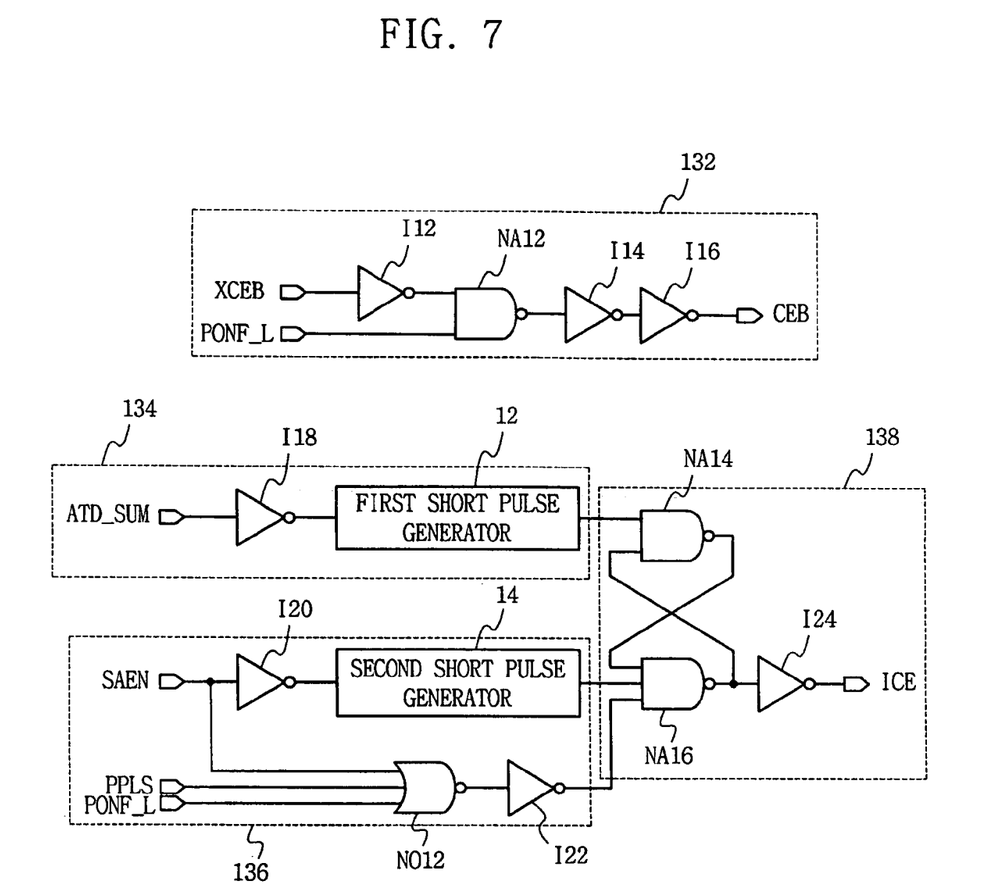
FIG. 7 illustrates the internal chip enable signal generation circuit of FIG. 5.

FIG. 7 illustrates the internal chip enable signal generation circuit of FIG. 5.

As shown in FIG. 7, the internal chip enable (ICE) signal generation circuit includes an external signal control unit 132, a first input unit 134, a second input unit 136 and an output unit 138.

The external signal control unit 132 includes a fourth inverter circuit 112 to which an external chip control signal XCEB is input, a first NAND gate NA12 having inputs of the output of the fourth inverter 112 and the power detection signal PONF_L, and fifth and sixth inverters I14 and I16 that are connected in series to perform buffering for the output of the first NAND gate NA12 to output an external signal controlling signal CEB.

In the external signal control unit 132, when the external chip control signal XCEB is enabled and the power detection signal PONF_L is not applied, the external signal controlling signal CEB is enabled to control generation of a composite pulse signal ATD_SUM by a transition of an address signal externally input. For example, when the external chip control signal XCEB is enabled as a 'low' logic level and the detection signal PONF_L has a 'high' logic level, the external signal controlling signal CEB is enabled as a 'low' logic level so that an address signal is externally input.

When the external chip control signal XCEB has a disabled state, the external signal controlling signal CEB maintains a disabled state, and even though the external chip control signal XCEB has an enabled state and when the power detection signal PONF_L is applied, the external signal controlling signal CEB is disabled to cut off operating signals externally input. Thus, in the case where the external signal controlling signal CEB is disabled, an address signal is not externally input and the composite pulse signal ATD_SUM is not generated.

The first input unit 134 includes a seventh inverter I18 having an input of the composite pulse signal ATD_SUM, and a first short pulse generator 12 for generating a short pulse through an output of the seventh inverter I18. The short pulse generator 12 may be constructed of a plurality of inverters and a NAND gate. The short pulse generator 12 generates a short pulse having a predetermined width in response to the composite pulse signal ATD_SUM. The first input unit 134 controls the enabling of the ICE signal ICE and applies a short pulse generated in response to the composite pulse signal ATD_SUM, to the output unit 138, to enable the ICE signal ICE.

The second input unit 136 includes an eighth inverter I20 having an input of the sense amplifier enable signal SAEN, a second short pulse generator 14 for generating a short pulse by an output of the eighth inverter I20 and applying it to the output unit 138, a NOR gate NO12 responding to the sense amplifier enable signal SAEN, the plate control signal PPLS and the power detection signal PONF_L, and a ninth inverter I22 for inverting the output of the NOR gate NO12 and applying it to the output unit 138.

The second input unit 136 controls a disable time point of the ICE signal ICE, and when the power detection signal PONF_L is not applied, the sense amplifier enable signal SAEN is disabled and the ICE signal ICE is disabled. When the power detection signal PONF_L is applied, a disable time point of the ICE signal ICE differs by an applied time point of the power detection signal PONF_L. That is, when the power detection signal PONF_L is applied at a first time point when the ICE signal ICE is enabled as, e.g., a 'high' logic level, and the plate control signal PPLS is disabled as, e.g., a 'low' logic level, the second input unit 136 controls a signal output from the second input unit 136 so that the ICE signal ICE is disabled. Further, when the power detection signal PONF_L is applied at a second time point when the ICE signal ICE is enabled as, e.g., a 'high' logic level, and the plate control signal PPLS is enabled as, e.g., a 'high' logic level, the second input unit 136 controls a signal output from the second input unit 136 so that the ICE signal ICE maintains the enabled state.

The output unit 138 includes second and third NAND gates NA14 and NA16 that are mutually intersection connected as a latch circuit having an input of the output signals of the first input unit 134 and the second output unit 136, and a tenth inverter I24 for inverting the output of the latch circuit and outputting an ICE signal ICE. The ICE signal generation circuit referred to in FIG. 7 was described as one exemplary embodiment, thus the invention can be realized through various methods.

Figure 8:
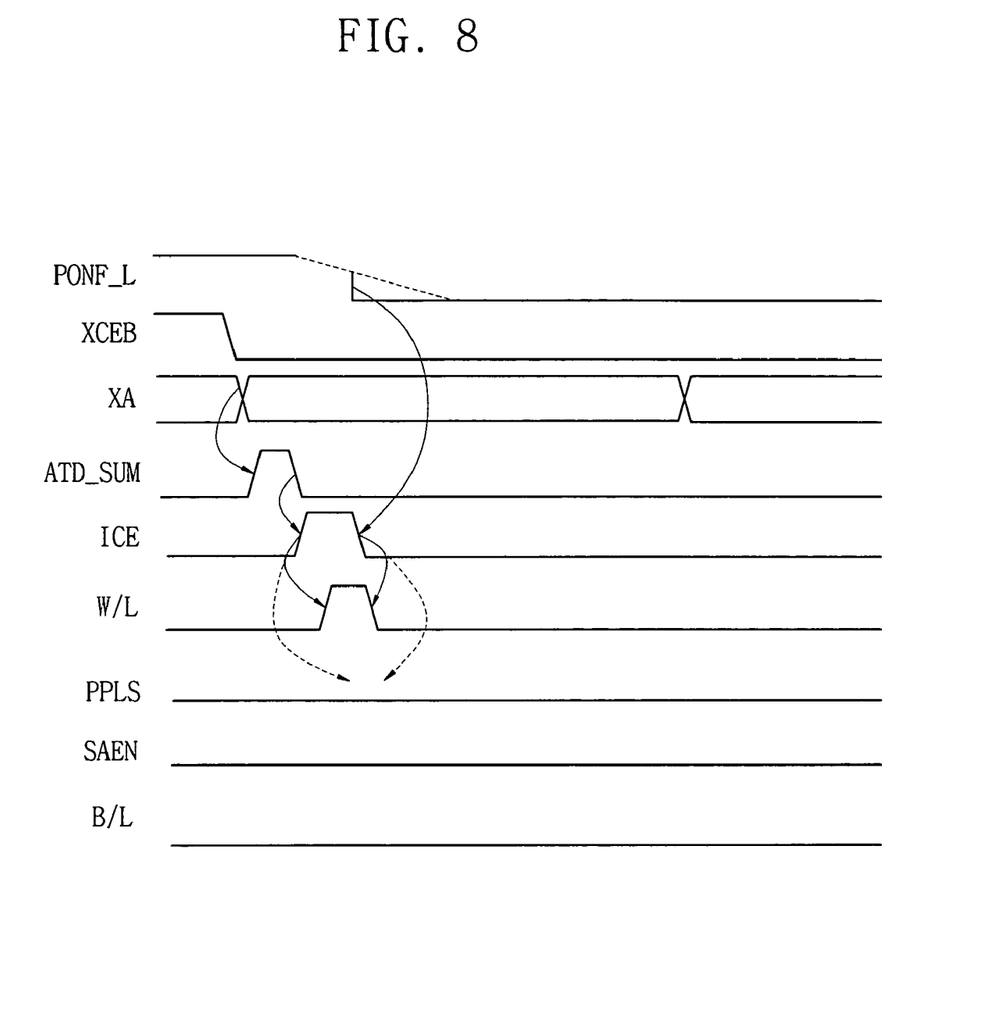
FIGS. 8 and 9 illustrate signal timing when a power source is turned off in a ferroelectric random access memory according to an exemplary embodiment of the invention.
Figure 9:
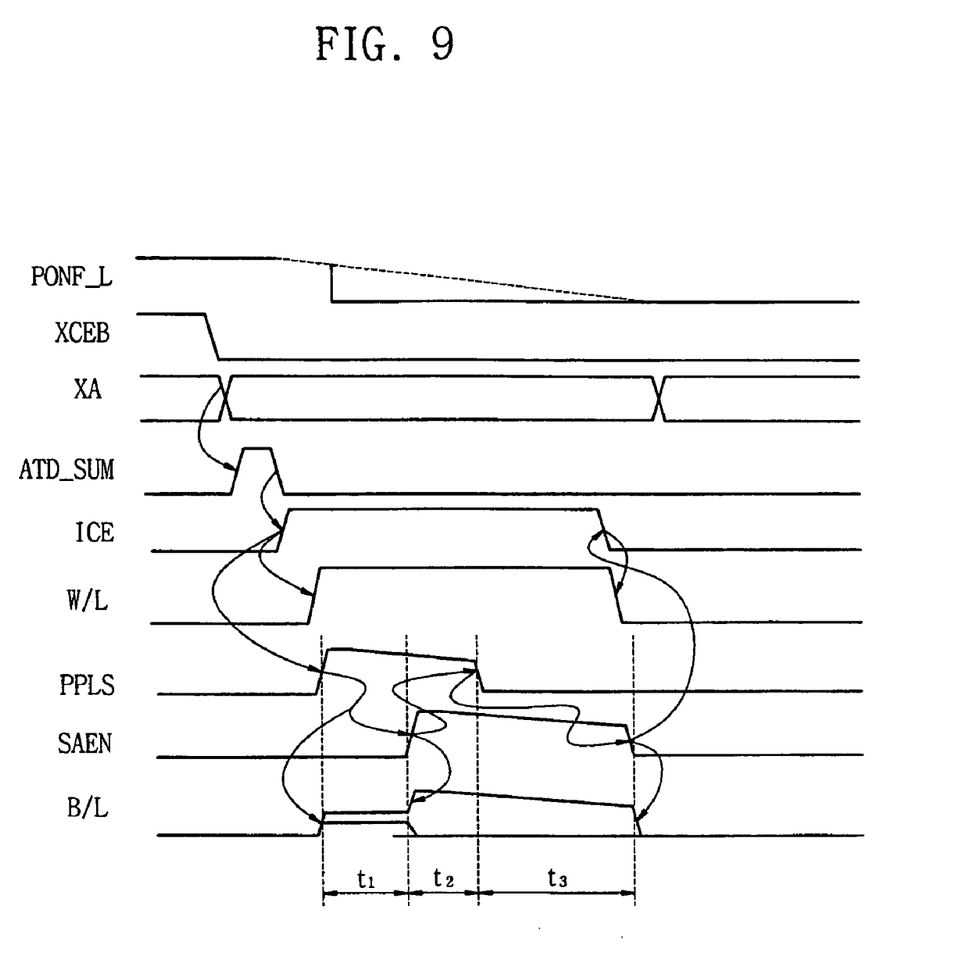

FIGS. 8 and 9 illustrate signal timing when a power source is turned off after a read operation starts in a ferroelectric random access memory according to an exemplary embodiment of the invention.

Operation in case the power source is turned off after a read operation begins in a ferroelectric random access memory (FRAM) device according to an exemplary embodiment will be described for FIGS. 8 and 9 and also with reference to FIG. 5.

FIG. 8 illustrates signal timing when a power source is turned off at a first time point.

As shown in FIG. 8, an external chip control signal XCEB transitions from a 'high' logic level to a 'low' logic level to be enabled, and a read operation begins, under a state that a power source is supplied initially normally.

An external address signal XA is applied by an enabling of the external chip control signal XCEB. The external address signal XA is applied to an address buffer (not shown), and the address buffer buffers the applied external address signal XA and generates an internal address signal, and detects a transition of the internal address signal and generates address transition detection signals for respective address signals. The address transition detection signals are combined by a composite pulse signal generation circuit (not shown), and becomes a composite pulse signal ATD_SUM as one address transition detection signal. The composite pulse signal ATD_SUM is a short pulse signal that is enabled for a predetermined time and then is disabled.

The ICE signal ICE is enabled by the composite pulse signal ATD_SUM.

The power source is turned off in the first time point that is after the ICE signal ICE is enabled and before the plate control signal PPLS is enabled. Hence, the power detection circuit 120 outputs a power detection signal PONF_L of 'low' logic level. In this state, the plate control signal PPLS and the sense amplifier enable signal SAEN maintain a disabled state. Herewith, a word line W/L may be an enabled state or a disabled state.

The power detection signal PONF_L is applied to the internal chip enable signal generation circuit 130, thereby the internal chip enable signal generation circuit 130 disables the internal chip enable signal ICE that had an enabled state. Thus the plate control signal PPLS is not enabled and read operation is stopped. That is, data stored at memory cells can be protected.

FIG. 9 illustrates signal timing when the power source is turned off at a second time point.

As shown in FIG. 9, an external chip control signal XCEB is transited from a 'high' logic level to a 'low' logic level so as to be enabled and so read operation starts, in a state that power source is supplied initially normally.

An external address signal XA is applied by an enabling of the external chip control signal XCEB. The external address signal XA is applied to an address buffer circuit (not shown), and the address buffer circuit buffers the applied external address signal XA and generates an internal address signal, and detects a transition of the internal address signal and generates address transition detection signals for respective address signals. The address transition detection signals are combined by a composite pulse signal generation circuit, and so become a composite pulse signal ATD_SUM as one address transition detection signal. The composite pulse signal ATD_SUM is a short pulse signal that is enabled for determine time and then disabled.

The ICE signal ICE is enabled by the composite pulse signal ATD_SUM.

The ICE signal ICE is not generated in a transition for an enabling of the composite pulse signal ATD_SUM, but can be generated in a transition for a disabling of the composite pulse signal ATD_SUM, that is, after all address transition detection signals are applied.

When the ICE signal ICE is generated, a word line W/L is enabled by a word line decoder and driver circuit (not shown). A plate line P/L is enabled by an enabling of the plate control signal PPLS generated in response to the ICE signal ICE.

The power source of the FRAM device is turned off at a second time point after the plate control signal PPLS is enabled, and the power detection circuit 120 outputs a power detection signal PONF_L of 'low' logic level.

In the ICE signal generation circuit 130, an enabled state of the ICE signal ICE is continuously maintained by the power detection signal PONF_L and the plate control signal PPLS having an enabled state. As the ICE signal ICE is continuously maintained in the enabled state, a charge sharing section $t_1$ starts like in a normal read operation. At the charge sharing section $t_1$, a voltage corresponding to the data stored at a memory cell is developed on a bit line B/L maintaining a ground voltage level.

Next, a sense amplifier enable signal SAEN responding to an enable of the plate control signal PPLS is generated to enable a sense amplifier. When the sense amplifier is enabled, the charge sharing section $t_1$ is ended, and a sensing section $t_2$ starts. At the sensing section $t_2$, data developed to the bit line B/L is sensed and amplified at the sense amplifier.

The sensing section $t_2$ is ended as the plate line P/L is disabled by the plate control signal, and a write-back section $t_3$ starts.

Herewith, the charge sharing section $t_1$ and the sensing section $t_2$ have values decided by an internal circuit.

The write-back section $t_3$ is to restore the original data to solve an effect that the data stored at a memory cell is reversed when a plate line is enabled for a read operation. The write-back section $t_3$ should be stable for a sufficient time to prevent a loss of data stored at a memory cell.

The write-back section $t_3$ is maintained until a time point when the sense amplifier is disabled after the plate line P/L is disabled and then a predetermined time lapses. The disabling of the sense amplifier can be generated in response to the disabling of the plate line or in response to a transition to enable a second composite pulse signal ATD_SUM.

When the sense amplifier is disabled, the ICE signal ICE is disabled and thus the word line W/L is disabled and the read operation is completed.

As described above, when the power source is turned off at the second time point of a read operation in the memory device, the read operation continues to ensure at least a restoring section, thereby reducing a loss of data stored at memory cells.

Figure 10:
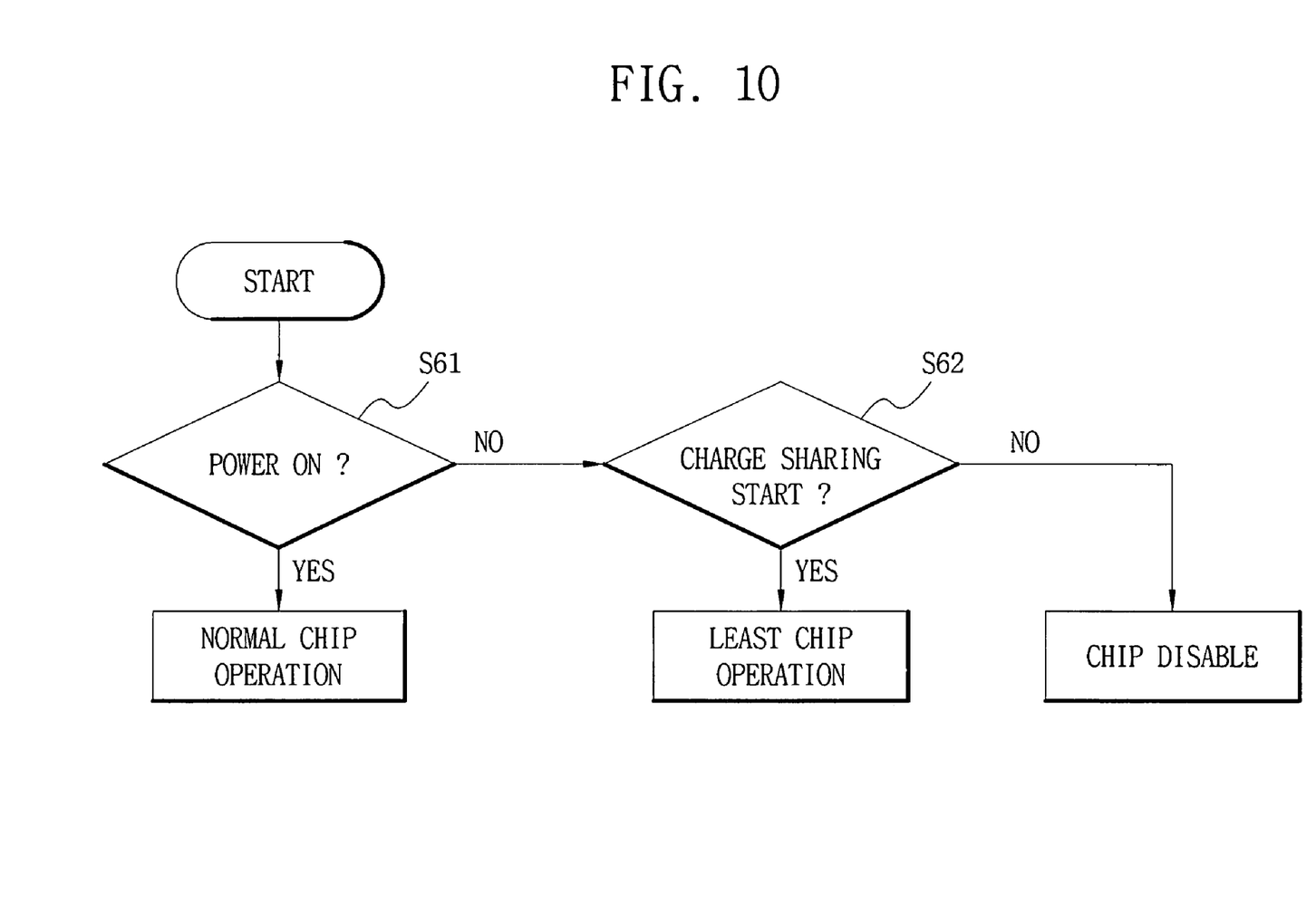
FIG. 10 is a flowchart to protect data of memory cells in a ferroelectric random access memory according to an exemplary embodiment of the invention.

FIG. 10 is a flowchart to protect data of memory cells in a ferroelectric random access memory according to an exemplary embodiment of the invention.

As shown in FIG. 10, read operation starts in a ferroelectric random access memory (FRAM) device according to an exemplary embodiment of the invention, and an internal chip enable (ICE) signal is enabled. Then the memory device senses step S61 whether an external power source has an on state. If it is in the on state, a normal chip operation such as a read operation is performed in the FRAM device. If it is in an off state, it is determined step S62 whether a charge sharing to read data stored at a memory cell began in the memory device. If the charge sharing started, at least the time necessary for a current operation state is maintained to continue the read operation. When the charge sharing did not start, the read operation is halted to disable the chip.

That is, an external power source is turned off in a state that an ICE signal ICE is enabled, and then according to a time point when the external power source is turned off, its control operation differs, thus reducing a loss of data in memory cells, in a FRAM device and a control method thereof according to an exemplary embodiment of the invention.

As described above, according to an exemplary embodiment of the invention, when power source is turned off in a state that an ICE signal ICE maintains an enabled state, a state of the ICE signal ICE differs by an off time point of the power source, thereby reducing a loss of data in the FRAM device.

While the present invention has been particularly shown and described with reference to exemplary embodiments thereof, it will be understood by those skilled in the art that various changes in form and details may be made therein without departing from the spirit and scope of the present invention as defined by the appended claims. For example, internal configuration of the circuit can be varied or internal elements of the circuit can be replaced with other equivalent elements. Accordingly, these and other changes and modifications are seen to be within the true spirit and scope of the invention as defined by the appended claims.

What is claimed is:

1. A ferroelectric random access memory (FRAM) device, comprising:
   a power supply node for receiving a power source supplied to the FRAM device;
   a power detection circuit for detecting a voltage level at the power supply node and generating a detection signal when the voltage level is low; and
   an internal chip enable (ICE) signal generation circuit for disabling an ICE signal to halt an operation of the FRAM device when the ICE signal is enabled and the detection signal is applied at a first time point, and for maintaining an enabled state of the ICE signal to continue the operation of the FRAM device when the detection signal is applied at a second time point.

2. The FRAM device of claim 1, wherein the first time point occurs before a control signal for the operation of the FRAM device is generated in response to the ICE signal, and the second time point occurs after a control signal for the operation of the FRAM device is generated in response to the ICE signal.

3. The FRAM device of claim 2, wherein the operation of the FRAM device is a read operation to read data stored at a selected memory cell in the FRAM device.

4. The FRAM device of claim 2, further comprising,
   a plate control signal generation circuit for generating a plate control signal for enabling or disabling a plate line connected to the memory cell in response to an ICE signal; and
   a sense amplifier enable signal generation circuit for enabling or disabling a sense amplifier enable signal for driving a sense amplifier in response to the plate control signal.

5. The FRAM device of claim 4, wherein the first time point occurs before the plate control signal is enabled, and the second time point occurs after the plate control signal is enabled.

6. The FRAM device of claim 5, wherein the ICE signal generation circuit enables and disables the ICE signal in response to a composite pulse signal, wherein the composite pulse signal is obtained by detecting an applied external address transition and by combining respective address transition detection signals, the detection signal, the plate control signal and the sense amplifier enable signal.

7. The FRAM device of claim 6, wherein when the detection signal is not applied, the ICE signal generation circuit enables the ICE signal in response to the composite pulse signal, when the detection signal is applied at the first time point, the ICE signal generation circuit disables the ICE signal in response to the plate control and sense amplifier enable signals having disabled states, and the detection signal, and when the detection signal is applied at the second time point, the ICE signal generation circuit maintains an enabled state of the ICE signal in response to the plate control and sense amplifier enable signals having enabled states, and the detection signal.

8. A ferroelectric random access memory (FRAM) device, comprising:
   a plurality of memory cells, wherein each memory cell includes an access transistor and a ferroelectric capacitor;
   a power supply for supplying a power source to the FRAM device;
   a power detection circuit for detecting a voltage level of the power source of the power supply and generating a detection signal when the power source is in an off state; and
   an internal chip enable (ICE) signal generation circuit for disabling an ICE signal to stop an operation of the FRAM device when the ICE signal is enabled and the detection signal is applied at a first time point, and for maintaining an enabled state of the ICE signal to continue the operation of the FRAM device when the detection signal is applied at a second time point,
   wherein the FRAM device controls an enabled or disabled state of the ICE signal that controls an enable of word lines and plate lines connected with the memory cells.

9. The FRAM device of claim 8, wherein the first time point occurs before a plate control signal for the enabling of the plate lines is enabled in response to the ICE signal, and the second time point occurs after the plate control signal is enabled in response to the ICE signal.

10. The FRAM device of claim 9, wherein the operation of the FRAM device is a read operation to read data stored at a selected memory cell in the FRAM device.

11. The FRAM device of claim 9, further comprising,
a plate control signal generation circuit for generating the plate control signal for enabling or disabling the plate lines connected to the memory cell in response to the ICE signal; and
a sense amplifier enable signal generation circuit for enabling or disabling a sense amplifier enable signal for driving a sense amplifier in response to the plate control signal.

12. The FRAM device of claim 11, wherein the ICE signal generation circuit enables and disables the ICE signal in response to a composite pulse signal obtained by detecting an applied external address transition and combining respective address transition detection signals, the detection signal, the plate control signal and the sense amplifier enable signal.

13. The FRAM device of claim 12, wherein when the detection signal is not applied, the ICE signal generation circuit enables the ICE signal in response to the composite pulse signal, when the detection signal is applied at the first time point, the ICE signal generation circuit disables the ICE signal in response to the plate control and sense amplifier enable signals having disabled states, and the detection signal, and when the detection signal is applied at the second time point, the ICE signal generation circuit maintains an enabled state of the ICE signal in response to the plate control and sense amplifier enable signals having enabled states, and the detection signal.

14. A method of driving a ferroelectric random access memory (FRAM) device, the method comprising:
detecting a voltage level of a power source supplied to the FRAM device;
generating a detection signal when the power source is in an off state;
enabling an internal chip enable (ICE) signal to control generation of control signals for controlling the FRAM device to perform an operation in the FRAM device when the detection signal is not generated;
disabling the ICE signal to stop the operation of the memory device when the detection signal is generated at a first time point, and
maintaining an enabled state of the ICE signal so that the operation of the memory device continues when the detection signal is generated at a second time point.

15. The method of claim 14, wherein the operation of the FRAM device is a read operation to read data stored at a memory cell of the FRAM device.

16. The method of claim 14, wherein the first time point occurs before a plate control signal is enabled, the second time point occurs after the plate control signal is enabled, and the plate control signal controls a plate line connected to the memory cell and responds to the ICE signal.

* * * * *